United States Patent
Pyeon

(10) Patent No.: US 9,130,133 B2
(45) Date of Patent: Sep. 8, 2015

(54) LIGHT-EMITTING DEVICE PACKAGE AND METHOD OF MANUFACTURING THE SAME

(75) Inventor: In-joon Pyeon, Gyeonggi-do (KR)

(73) Assignee: SAMSUNG ELECTRONICS CO., LTD., Seoul (KR)

(*) Notice: Subject to any disclaimer, the term of this patent is extended or adjusted under 35 U.S.C. 154(b) by 392 days.

(21) Appl. No.: 13/421,337

(22) Filed: Mar. 15, 2012

(65) Prior Publication Data

US 2012/0241804 A1  Sep. 27, 2012

(30) Foreign Application Priority Data

Mar. 25, 2011 (KR) .................. 10-2011-0027175

(51) Int. Cl.
 *H01L 33/00* (2010.01)
 *H01L 33/52* (2010.01)
 *H01L 23/00* (2006.01)

(52) U.S. Cl.
 CPC ............ *H01L 33/52* (2013.01); *H01L 24/97* (2013.01); *H01L 2224/48091* (2013.01); *H01L 2224/48247* (2013.01); *H01L 2924/12041* (2013.01); *H01L 2933/005* (2013.01)

(58) Field of Classification Search
 CPC .............................. H01L 33/52; H01L 33/54
 USPC ................... 257/99, 100, E33.058, E33.059; 438/26–28
 See application file for complete search history.

(56) References Cited

U.S. PATENT DOCUMENTS

2006/0186423 A1* 8/2006 Blonder et al. .................. 257/98
2010/0123156 A1* 5/2010 Seo et al. ......................... 257/99

FOREIGN PATENT DOCUMENTS

| KR | 10-2006-0135498 A | 12/2006 |
| KR | 10-2007-0117865 A | 12/2007 |
| KR | 10-0790741 B1 | 12/2007 |

\* cited by examiner

*Primary Examiner* — Daniel Shook
(74) *Attorney, Agent, or Firm* — McDermott Will & Emery LLP

(57) ABSTRACT

A light-emitting device package and method of manufacturing the same. The method includes: preparing a package main body comprising a plurality of cavities, wherein a light-emitting device chip is mounted in each of the cavities and a through hole is formed in a bottom of each of the cavities; preparing a fixed mold providing a first surface that blocks the cavity; coupling the package main body to the fixed mold such that an end portion of the cavity contacts the first surface; supplying an encapsulation material into the cavity through the through hole; hardening the encapsulation material; and separating the package main body from the fixed mold, and dicing the package main body into a plurality of light-emitting device packages using a singulation operation. The encapsulation material is supplied while disposing the package main body on the fixed mold so that the encapsulation material is supplied in a gravitational direction.

20 Claims, 5 Drawing Sheets

LIGHT-EMITTING DEVICE PACKAGE AND METHOD OF MANUFACTURING THE SAME

CROSS-REFERENCE TO RELATED APPLICATIONS

This application claims the benefit of Korean Patent Application No. 10-2011-0027175, filed on Mar. 25, 2011, in the Korean Intellectual Property Office, the disclosure of which is incorporated herein in its entirety by reference.

BACKGROUND

1. Field

The present disclosure relates to light-emitting device packages and methods of manufacturing the same, and more particularly, to light-emitting device packages and methods of manufacturing the same, in which color scattering caused due to non-uniform shrinking of an encapsulation material of the light-emitting device packages is prevented.

2. Description of the Related Art

A light emitting diode (LED) is a semiconductor device capable of emitting light of various colors via a light emitting source that includes a PN junction of compound semiconductors. The LED has a long life span, is compact and light, and has intense optical directivity, and thus can be driven at a low voltage. In addition, the LED is rigid against impacts or vibrations, does not require a preheating time or complicated driving, and may be packaged in various forms, and thus can be applied for various purposes.

A light-emitting device package is manufactured by coating a light-emitting device chip such as a LED with an encapsulation material in a package main body.

A method of manufacturing a LED package includes a die bonding operation in which a LED chip is adhered to a substrate using an adhesive, a wire bonding operation providing an electric wiring on the LED chip, and an encapsulating operation in which the LED chip is encapsulated to protect and electrically insulate the LED chip from the external environment.

The encapsulating operation may include coating a structure having a cavity or a dam with silicon or epoxy by using a dispensing method.

In the dispensing method, an ejection amount of an encapsulation material is adjusted according to an operating duration of dispenser equipment, and for a large-scale manufacture, variation of the ejection amount is caused by deviations between dispensing equipments or a hardening degree of the encapsulation material due to an operation standby time. In addition, even though the encapsulation material is ejected such that an upper surface of the encapsulation material is flatly formed, the form of the encapsulation material after hardening may be changed to a concave form due to shrinking of the encapsulation material or scattering rate thereof, which may cause color scattering defects.

SUMMARY

Provided are light-emitting device packages and methods of manufacturing the same, whereby light-emitting device defects due to deviations in ejection amounts of an encapsulation material are prevented.

Additional aspects will be set forth in part in the description which follows and, in part, will be apparent from the description, or may be learned by practice of the presented embodiments.

According to an aspect of the present invention, a light-emitting device package includes: a structure having a cavity; a light-emitting device chip mounted on a bottom of the cavity; at least one through hole formed in the bottom of the cavity; and an encapsulation material that is substantially horizontally filled in the cavity, wherein the encapsulation material fills at least a portion of the through hole.

The structure may be a mold formed of a synthetic resin material.

The structure may include a substrate and a dam disposed on the substrate in the form of the cavity.

According to another aspect of the present invention, a method of manufacturing a light-emitting device package, includes: preparing a package main body including a plurality of cavities, wherein a light-emitting device chip is mounted in each of the cavities, wherein a through hole is formed in a bottom of the cavity; preparing a fixed mold providing a first surface that blocks the cavity; coupling the package main body to the fixed mold such that an end portion of the cavity contacts the first surface; supplying an encapsulation material into the cavity through the through hole; hardening the encapsulation material; and separating the package main body from the fixed mold, and dicing the package main body into a plurality of the light-emitting device package using a singulation operation, wherein the encapsulation material is supplied while disposing the package main body on the fixed mold so that the encapsulation material is supplied in a gravitational direction.

The encapsulation material may be supplied to fill the cavity and at least a portion of the through hole.

An amount of the encapsulation material in the through hole may be reduced in a gravitational direction when the encapsulation material shrinks during hardening.

A diameter of the through hole may be designed such that the encapsulation material still remains inside the through hole when the encapsulation material shrinks.

A plurality of through holes may be formed in the cavity.

The first surface may be a flat surface.

According to another aspect of the present invention, a method of manufacturing a light-emitting device package, includes: preparing a substrate including a plurality of light-emitting device chips mounted on a surface of the substrate, and a plurality of dams surrounding the plurality of light-emitting device chips, wherein a through hole is formed in a bottom of a cavity formed by the plurality of dams; preparing a fixed mold providing a first surface that blocks end portions of the plurality of dams to define space of the cavity; coupling the substrate to the fixed mold such that the end portions of the plurality of the dams contacts the first surface; supplying an encapsulation material into the cavity through the through hole; hardening the encapsulation material; and separating the substrate from the fixed mold, and dicing the substrate into a plurality of light-emitting device packages using a singulation operation, wherein the encapsulation material is supplied while disposing the substrate on the fixed mold such that the encapsulation material is supplied in a gravitational direction.

A groove to accommodate the dams may be formed in the fixed mold, and a bottom of the groove may include the first surface of the fixed mold.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
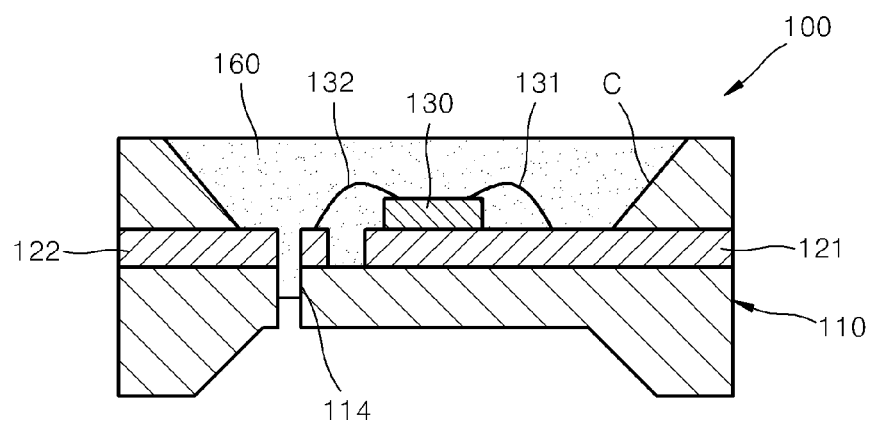
FIG. 1 is a schematic cross-sectional view illustrating a light-emitting device package according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a schematic cross-sectional view illustrating a light-emitting device package 100 according to an embodiment of the present invention.

Referring to FIG. 1, a first lead frame 121 and a second lead frame 122 are separated from each other in a cavity C (also referred to as a concave portion) formed in an upper portion of a molding member 110. The molding member 110 includes a lower portion supporting the first and second lead frames 121 and 122 and the upper portion in which the cavity C is formed. A light-emitting device chip 130 is mounted in the cavity C. The cavity C may include a reflection surface that reflects light emitted from the light-emitting device chip 130 to the outside. The molding member 110 may be formed of a synthetic resin such as an epoxy resin, etc. The molding member 110 may be formed using a typical molding process.

The light-emitting device chip 130 is mounted on and electrically connected to the first lead frame 121. For example, the light-emitting device chip 130 may be connected to the first lead frame 121 via a wire 131. The light emitting device 130 may be bonded to the second lead frame 122 via a wire 132. The wire 131 may also be omitted according to the structure of the light-emitting device chip 130.

A through hole 114 that communicates with the cavity C is vertically formed through the molding member 110. The through hole 114 may be formed through the second lead frame 122 as illustrated in FIG. 1 or may be formed through the first lead frame 121. Alternatively, the through hole 114 may be formed not to pass through the first lead frame 121 and the second lead frame 122.

An encapsulation material 160 is injected into the cavity C via the through hole 114. The encapsulation material 160 is filled in at least a portion of the 114. A transmissive resin including a phosphor or a transparent material may be used as the encapsulation material 160 according to the color to be emitted by the light-emitting device chip 130. The encapsulation material 160 fills the cavity C substantially horizontally.

Although one through hole 114 is formed in the cavity C in FIG. 1, the embodiment of the present invention is not limited thereto. For example, a plurality of through holes 114 may be formed in one cavity C. Also, a diameter of the through hole 114 may be designed such that the encapsulation material 160 still remains inside the through hole 114 even when the encapsulation material 160 shrinks during the manufacturing of the light-emitting device package 100.

Figure 2:
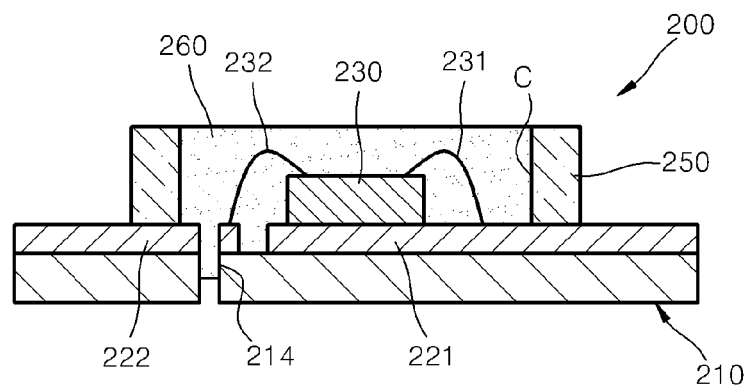
FIG. 2 is a schematic cross-sectional view illustrating a light-emitting device package according to another embodiment of the present invention.

FIG. 2 is a schematic cross-sectional view illustrating a light-emitting device package 200 according to another embodiment of the present invention.

Referring to FIG. 2, a dam 250 that forms a cavity C is disposed on a substrate 210. The substrate 210 may be formed of a ceramic or a synthetic resin or may be a printed circuit board. The dam 250 may be formed on the substrate 210 to have a circular or rectangular form. The dam 250 may be formed of epoxy or silicon. A first lead frame 221 and a second lead frame 222 are disposed on the substrate 210. The lead frames 221 and 222 may be formed by patterning a metal thin film on the substrate 210.

A light-emitting device chip 230 is mounted on and electrically connected to the first lead frame 221. For example, the light-emitting device chip 230 may be connected to the first lead frame 221 via a wire 231. The light-emitting device chip 230 may be bonded to the second lead frame 222 via a wire 232.

A through hole 214 that communicates with the cavity C is vertically formed through the substrate 210. The through hole 214 may be formed through the second lead frame 222 as illustrated in FIG. 2 or may be formed through the first lead frame 221. Alternatively, the through hole 214 may be formed not to pass through the first lead frame 221 and the second lead frame 222.

An encapsulation material 260 is filled in the cavity C through the through hole 214. The encapsulation material 260 fills the cavity C substantially horizontally. The encapsulation material 260 may fill at least a portion of the through hole 214. A transmissive resin including a phosphor or a transparent material may be used as the encapsulation material 260 according to the color to be emitted by the light-emitting device chip 230.

Although one through hole 214 is formed in the cavity C in FIG. 2, the embodiment of the present invention is not limited thereto. For example, a plurality of through holes 214 may be formed in one cavity C.

As an upper surface of the cavity C is filled horizontally with the encapsulation material in the light-emitting device package 200 according to the current embodiment of the present invention, color scattering defects due to non-uniformity of the encapsulation material may be prevented.

FIGS. 3A through 3E are cross-sectional views illustrating a method of manufacturing a light-emitting device package according to an embodiment of the present invention.

Figure 3A:
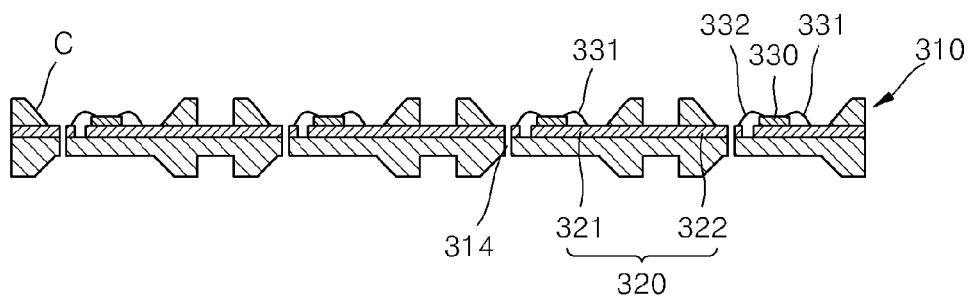
FIGS. 3A through 3E are cross-sectional views illustrating a method of manufacturing a light-emitting device package according to an embodiment of the present invention.

Referring to FIG. 3A, a plurality of lead frames 320 are separated from each other in a package main body 310 in which a plurality of cavities C (or referred to as a concave portion) are formed. Each lead frame 320 is cut in a dicing operation into a first lead frame 321 and a second lead frame 322 which form a pair.

The package main body 310 includes a lower portion supporting the lead frames 320 and an upper portion providing the cavities C in which a light-emitting device chip 330 is mounted. The cavity C may include a reflection surface that reflects light emitted from the light-emitting device chip 330 to the outside. The package main body 310 may be formed of a synthetic resin such as an epoxy resin, etc. The package main body 310 may be formed using a typical molding process.

The light-emitting device chip 330 is mounted on and electrically connected to the first lead frame 321. For example, the light-emitting device chip 330 may be connected to the first lead frame 321 via a wire 331. The light emitting device 330 may be bonded to the second lead frame 322 via a wire 332. The wire 331 may also be omitted according to the structure of the light-emitting device chip 330.

A through hole 314 that communicates with the cavity C is vertically formed through the package main body 310. The through hole 314 may be formed through the second lead frame 322 as illustrated in FIG. 3A or may be formed through the first lead frame 321. Alternatively, the through hole 314 may be formed not to pass through the first lead frame 321 and the second lead frame 322.

In FIG. 3A, the plurality of light-emitting device chips 330 are arranged in series in the package main body 310, but the embodiment of the present invention is not limited thereto. For example, the plurality of light-emitting device chips 330 may be arranged in a matrix arrangement.

Figure 3B:
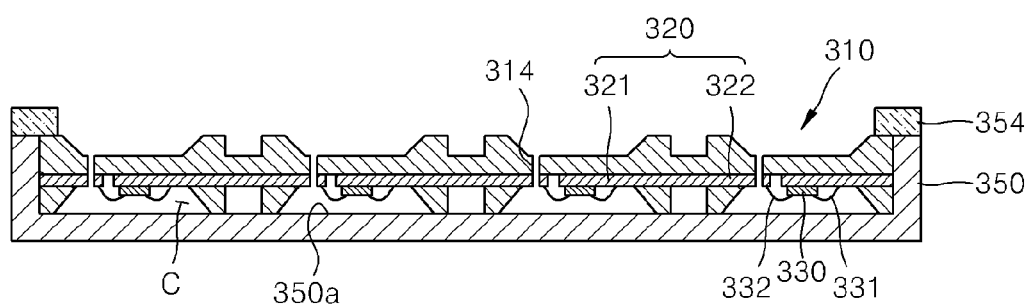

Referring to FIG. 3B, a fixed mold 350 corresponding to the package main body 310 is prepared. The fixed mold 350 may have a first surface 350a contacting the upper portion of the package main body 310 providing the cavities C. The fixed mold 350 has a space accommodating the package main body 310. The first surface 350a may be a flat surface.

Next, an end portion of the upper portion of the package main body 310 is disposed to contact the first surface 350a of the fixed mold 350.

Next, the package main body 310 is fixed on the fixed mold 350. To this end, an upper portion of the fixed mold 350 may be formed to have the same height as the lower portion of the package main body 310. A support portion 354 supporting the lower portion of the package main body 310 may be disposed on the upper portion of the fixed mold 350.

Figure 3C:
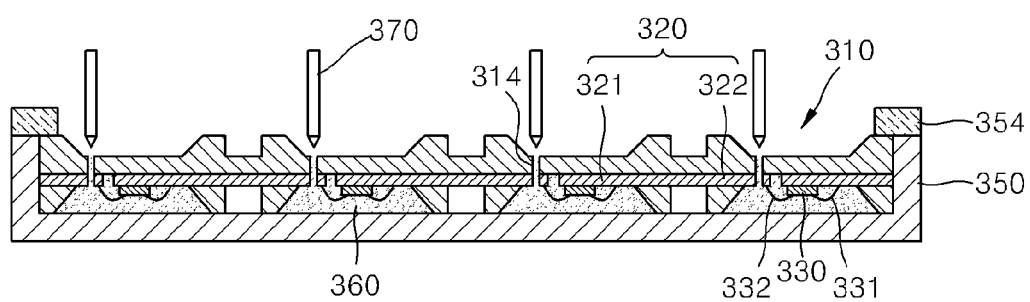

Referring to FIG. 3C, the upper portion of the package main body 310 is directed substantially downward, an encapsulation material 360 is injected through the through hole 314 to fill the cavity C. The encapsulation material 360 may be injected by using a typical dispenser (not shown) having a syringe 370. The encapsulation material 360 is injected so as to fill at least a portion of the through hole 314. The injected encapsulation material 360 fills the through hole 314 starting first from a portion contacted by the first surface 350a due to a gravitational effect. A transmissive resin including a phosphor or a transparent material may be used as the encapsulation material 360 according to the color to be emitted by the light-emitting device chip 330.

Figure 3D:
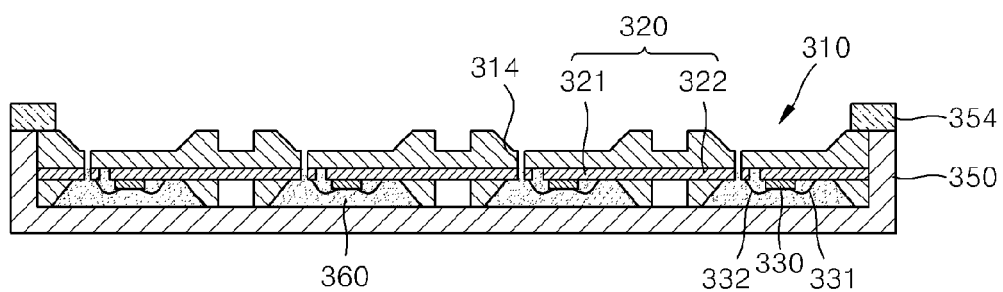

Referring to FIG. 3D, the encapsulation material 360 is hardened. A hardening temperature and hardening time may vary according to the encapsulation material 360 that is used, and detailed description thereof will be omitted. If the encapsulation material 360 shrinks during hardening, an amount corresponding to the shrunk encapsulation material 360 in the cavity C is compensated by the encapsulation material 360 in the through hole 314, thus, the amount of the encapsulation material 360 in the cavity C is hardly changed.

Meanwhile, the light-emitting device package may be designed such that the encapsulation material 360 in the through hole 314 compensates for reduction of the encapsulation material 360 in the cavity C. Although one through hole 314 is formed in the cavity C, the embodiment of the present invention is not limited thereto. For example, a plurality of through holes 314 may be formed in a cavity C. Also, a diameter of the through hole 314 may be designed such that the encapsulation material 360 still remains inside the through hole 314 even when the encapsulation material 360 shrinks during the manufacturing of the light-emitting device package 100.

Figure 3E:
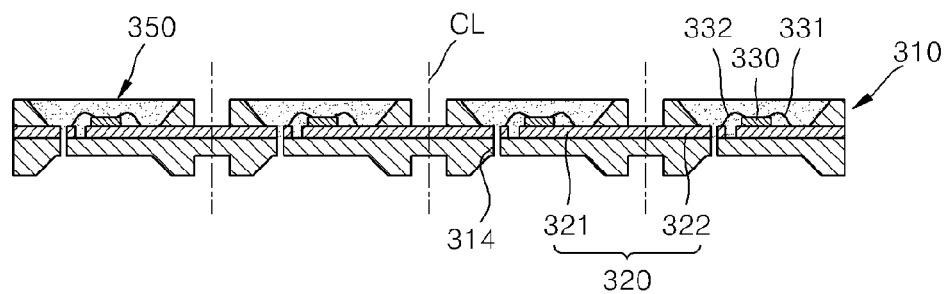

Referring to FIG. 3E, the package main body 310 is separated from the fixed mold 350. The separated package main body 310 is diced with respect to a cutting line CL during a singulation operation, thereby manufacturing a plurality of light-emitting device packages 350.

According to the method of manufacturing a light-emitting device package of the current embodiment of the present invention, as the encapsulation material 360 fills the fixed mold 350 in a gravitational direction, the encapsulation material 360 is horizontally filled according to the form of the first surface 350a, and thus, deformation of the encapsulation material 360 due to shrinking during the hardening may be prevented. Consequently, color scattering caused due to shrinking scattering of the encapsulation material 360 in the conventional manufacturing method of the light-emitting device package may be prevented.

FIGS. 4A through 4E are cross-sectional views illustrating a method of manufacturing a light-emitting device package according to another embodiment of the present invention.

Figure 4A:
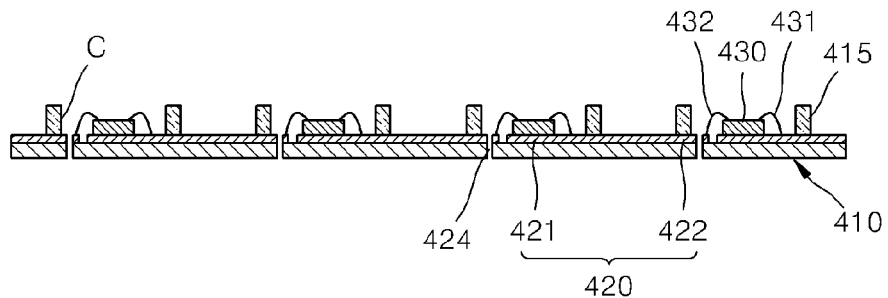
FIGS. 4A through 4E are cross-sectional views illustrating a method of manufacturing a light-emitting device package according to another embodiment of the present invention.

Referring to FIG. 4A, a dam 415 that forms a cavity C is disposed on a substrate 410. The substrate 410 may be formed of a ceramic or a synthetic resin or may be a printed circuit board. The dam 415 may have a circular or rectangular shape, and may be formed of epoxy or silicon. A plurality of lead frames 420 are separately disposed on the substrate 410. The lead frame 420 is cut during a dicing operation into a first lead frame 421 and a second lead frame 422 which form a pair. Alternatively, the lead frames 421 and 422 may be formed by forming a metal thin film on the substrate 410 and patterning the metal thin film.

A light-emitting device chip 430 is mounted on and electrically connected to the first lead frame 421. For example, the light-emitting device chip 430 may be connected to the first lead frame 421 via a wire 431. The light-emitting device chip 430 may be bonded to the second lead frame 422 via a wire 432.

A through hole 414 that communicates with the cavity C is vertically formed through the substrate 410. The through hole 414 may be formed through the second lead frame 422 as illustrated in FIG. 4a or may be formed through the first lead frame 421. Alternatively, the through hole 414 may be formed not to pass through the first lead frame 421 and the second lead frame 422.

In FIG. 4A, the plurality of light-emitting device chips 430 are arranged in series on the substrate 410, but the embodiment of the present invention is not limited thereto. For example, the plurality of light-emitting device chips 430 may be arranged in a matrix arrangement.

Figure 4B:
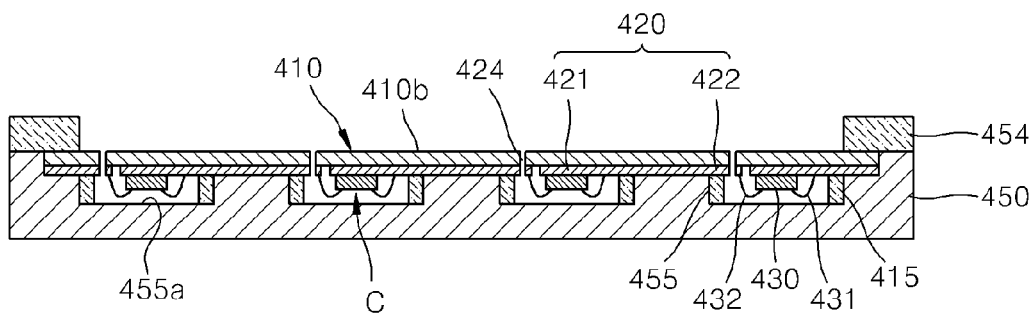

Referring to FIG. 4B, a fixed mold 450 corresponding to the substrate 410 is prepared. The fixed mol 450 have grooves 455 accommodating an end portion of the dame 415. The groove 455 includes a first surface 455a which contacts the end portion of the dam 415. The first surface 455a may be a flat surface. The depth of the groove 455 may be substantially the same as the height of the dam 415.

Next, the end portion of the dam 415 is brought in contact with the first surface 455a of the fixed mold 450.

Next, the substrate 410 is fixed to the fixed mold 450. To this end, an upper portion of the fixed mold 450 may be formed to correspond to a lower surface 410b of the substrate 410 as illustrated in FIG. 4B. A support portion 454 supporting the lower surface 410b of the substrate 410 may be disposed on the upper portion of the fixed mold 450.

Figure 4C:
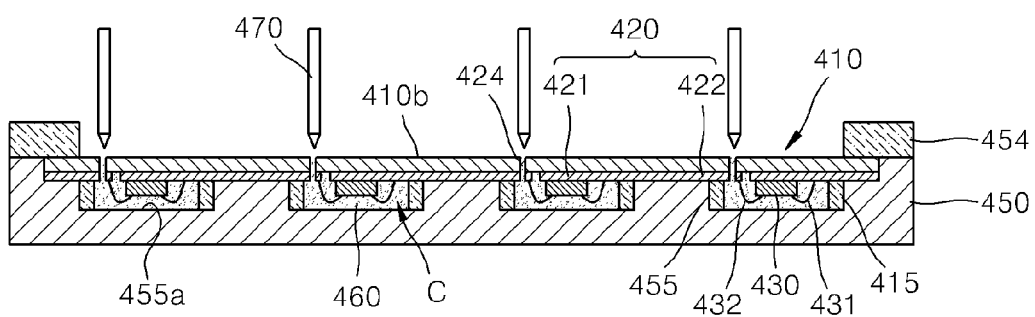

Referring to FIG. 4C, the upper portion of the substrate 410 is directed substantially downward, and an encapsulation material 460 is injected through the through hole 414 to fill the cavity C. The encapsulation material 460 may be injected by using a dispenser (not shown) having a syringe 470. The encapsulation material 460 is injected so as to fill at least a portion of the through hole 414. The injected encapsulation material 460 fills first a portion of the cavity C contacting the first surface 455a due to gravitational effect. A transmissive resin including a phosphor or a transparent material may be used as the encapsulation material 460 according to the color to be emitted by the light-emitting device chip 430.

Figure 4D:
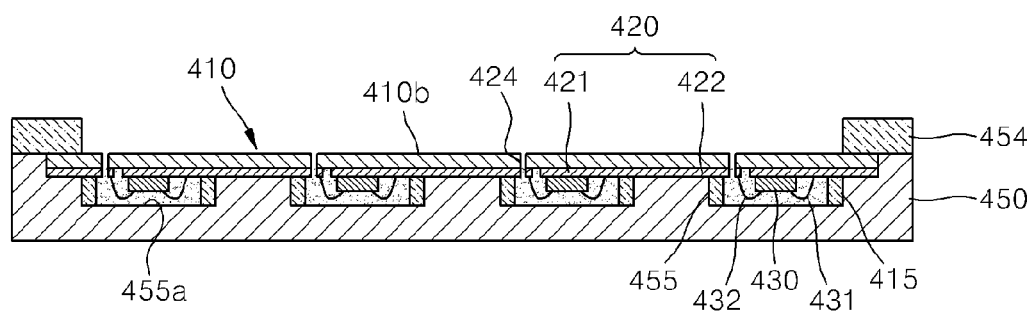

Referring to FIG. 4D, the encapsulation material 460 is hardened. A hardening temperature and hardening time may vary according to the encapsulation material 460 that is used, and detailed description thereof will be omitted. If the encapsulation material 460 shrinks during hardening, an amount of the encapsulation material 460 in the through hole 414 is reduced.

Meanwhile, the light-emitting device package may be designed such that the encapsulation material 460 in the through hole 414 compensates for reduction of the encapsulation in the cavity C. Although one through hole 214 is formed in the cavity C in FIG. 4D, the embodiment of the present invention is not limited thereto. The embodiment of the present invention is not limited thereto. For example, a plurality of through holes 414 may be formed in one cavity C. Also, a diameter of the through hole 414 may be designed such that the encapsulation material 460 still remains inside the through hole 414 even when the encapsulation material 460 shrinks during the manufacturing of a light-emitting device package.

Figure 4E:
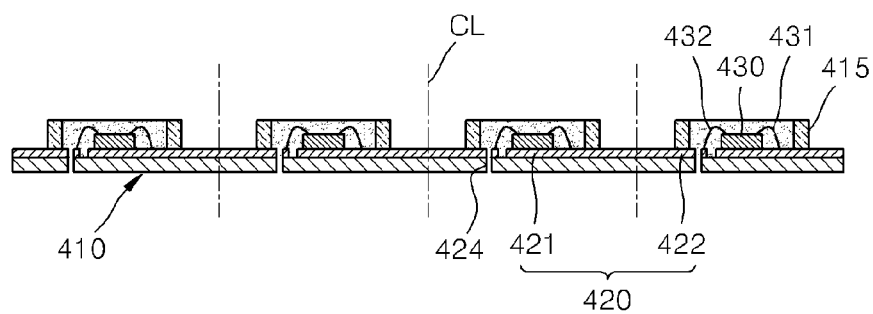

Referring to FIG. 4E, the substrate 410 is separated from the fixed mold 450. The separated substrate 410 is diced with respect to a cutting line CL in a singulation operation, thereby manufacturing a plurality of the light-emitting device packages.

According to the method of manufacturing a light-emitting device package of the current embodiment of the present invention, as the encapsulation material 460 fills the groove 455 of the fixed mold 450 in a gravitational direction, the encapsulation material 460 is horizontally filled according to the form of the first surface 455a of the fixed mold 450, and thus, deformation of the encapsulation material 460 due to shrinking and hardening of the encapsulation material 460 may be prevented. Consequently, color scattering caused due to shrinking variation of the encapsulation material in the conventional manufacturing method of the light-emitting device package may be prevented.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A light-emitting device package, comprising:
   a lead frame formed on a supporting member;
   a structure having a cavity exposing a portion of the lead frame and disposed at an opposite side of the lead frame with respect to the supporting member;
   a light-emitting device chip mounted on the exposed portion of the lead frame;
   at least one through hole penetrating through the supporting member and the lead frame; and
   an encapsulation material substantially horizontally filled in the cavity,
   wherein the encapsulation material fills a portion of the at least one through hole.

2. The light-emitting device package of claim 1, wherein the structure is a mold formed of a synthetic resin material.

3. The light-emitting device package of claim 1, wherein the encapsulation material fills only a portion of the at least one through hole.

4. The light-emitting device package of claim 1, wherein the encapsulation material is filled in the cavity of the structure to extend above the surface of the lead frame to a height that does not exceed the height of the structure extending above the surface of the lead frame.

5. The light-emitting device package of claim 1, wherein the encapsulation material is tilled in the cavity of the structure to extend above the surface of the lead frame to a height substantially equal to the height of the structure extending above the surface of the lead frame.

6. The light-emitting device package of claim 1, wherein the at least one through hole has a diameter selected such that the encapsulation material remains inside the at least one through hole even when the encapsulation material shrinks during manufacturing of the light-emitting device package.

7. The light-emitting device package of claim 1, wherein:
   the supporting member includes a cavity overlapping the at least one through hole,
   a width of the cavity of the supporting member is greater than a width of the at least one through, and
   the cavity of the supporting member contains no encapsulation material.

8. A method of manufacturing a light-emitting device package, the method comprising:
   preparing a package main body comprising a plurality of cavities, wherein a light-emitting device chip is mounted in each of the cavities, wherein a through hole is formed in a bottom of the cavity;
   preparing a fixed mold providing a first surface that blocks the cavity;
   coupling the package main body to the fixed mold such that an end portion of the cavity contacts the first surface;
   supplying an encapsulation material into the cavity through the through hole;
   hardening the encapsulation material; and
   separating the package main body from the fixed mold, and dicing the package main body into a plurality of the light-emitting device package using a singulation operation,
   wherein the encapsulation material is supplied while disposing the package main body on the fixed mold so that the encapsulation material is supplied in a gravitational direction.

9. The method of claim 8, wherein the encapsulation material is supplied to fill the cavity and at least a portion of the through hole.

10. The method of claim 9, wherein an amount of the encapsulation material in the through hole is reduced in a gravitational direction when the encapsulation material shrinks during hardening.

11. The method of claim 10, wherein a diameter of the through hole is designed such that the encapsulation material still remains inside the through hole when the encapsulation material shrinks.

12. The method of claim 10, wherein a plurality of through holes are formed in the cavity.

13. The method of claim 8, wherein the first surface is a flat surface.

14. A method of manufacturing a light-emitting device package, the method comprising:
   preparing a substrate comprising a plurality of light-emitting device chips mounted on a surface of the substrate, and a plurality of dams surrounding the plurality of light-emitting device chips, wherein a through hole is formed in a bottom of a cavity formed by the plurality of dams;

preparing a fixed mold providing a first surface that blocks end portions of the plurality of dams to define space of the cavity;

coupling the substrate to the fixed mold such that the end portions of the plurality of the dams contacts the first surface;

supplying an encapsulation material into the cavity through the through hole;

hardening the encapsulation material; and separating the substrate from the fixed mold, and dicing the substrate into a plurality of light-emitting device packages using a singulation operation, wherein the encapsulation material is supplied while disposing the substrate on the fixed mold such that the encapsulation material is supplied in a gravitational direction.

15. The method of claim 14, wherein a groove to accommodate the dams is formed in the fixed mold, and a bottom of the groove comprises the first surface of the fixed mold.

16. The method of claim 15, wherein the encapsulation material is supplied to fill the cavity and at least a portion of the through hole.

17. The method of claim 16, wherein an amount of the encapsulation material in the through hole is reduced in a gravitational direction when the encapsulation material shrinks during hardening.

18. The method of claim 17, wherein a diameter of the through hole is designed such that the encapsulation material remains inside the through hole when the encapsulation material shrinks.

19. The method of claim 17, wherein a plurality of through holes are formed in the cavity.

20. The method of claim 14, wherein the first surface is a flat surface.

\* \* \* \* \*